(12) United States Patent
Ishii et al.

(10) Patent No.: US 6,445,064 B1
(45) Date of Patent: Sep. 3, 2002

(54) SEMICONDUCTOR DEVICE

(75) Inventors: Hideki Ishii; Kazunari Michii; Jun Shibata; Moriyoshi Nakashima, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/906,794

(22) Filed: Jul. 18, 2001

(30) Foreign Application Priority Data

Feb. 6, 2001 (JP) ........................................ 2001-029786

(51) Int. Cl.[7] .............................................. H01L 23/02
(52) U.S. Cl. ...................... 257/686; 257/773; 257/758; 257/734; 257/737; 257/777; 257/778; 257/666
(58) Field of Search .................................. 257/775, 774, 257/783, 773, 758, 759, 738, 737, 777, 686, 778, 666

(56) References Cited

U.S. PATENT DOCUMENTS

| | | | | |
|---|---|---|---|---|
| 5,291,061 A | * | 3/1994 | Ball | 257/686 |
| 6,025,648 A | * | 2/2000 | Takahashi et al. | 257/778 |
| 6,239,496 B1 | * | 5/2001 | Asada | 257/777 |
| 6,256,760 B1 | * | 7/2001 | Inaba et al. | 257/666 |
| 6,258,626 B1 | * | 7/2001 | Wang et al. | 257/777 |
| 6,265,760 B1 | * | 7/2001 | Inaba et al. | 257/666 |
| 2002/0014689 A1 | * | 2/2002 | Lo et al. | 257/686 |

FOREIGN PATENT DOCUMENTS

| | | |
|---|---|---|
| JP | 4-276649 A | 10/1992 |
| JP | 10-116963 A | 5/1998 |

* cited by examiner

*Primary Examiner*—Nathan L. Flynn
*Assistant Examiner*—Pershelle Greene
(74) *Attorney, Agent, or Firm*—Leydig, Voit & Mayer, Ltd.

(57) ABSTRACT

A semiconductor device includes a first semiconductor package and a second semiconductor package which is mounted onto the first semiconductor package. The first semiconductor package has lands on an upper surface for mounting the second semiconductor package and lands on the lower surface for external connection, which are used for connection with a mounting substrate. The second semiconductor package has external leads which are connected to the lands for mounting the second semiconductor package.

13 Claims, 11 Drawing Sheets

SEMICONDUCTOR DEVICE

BACKGROUND OF THE INVENTION

1. Field of the Invention

The present invention relates to a semiconductor device which has a plurality of semiconductor packages.

2. Description of the Background Art

An example of a semiconductor device which has a plurality of semiconductor packages is disclosed in, for example, Japanese Patent Laying-open No. 10-116963 (1998). A semiconductor device described in this publication is shown in FIG. 13.

As shown in FIG. 13, the semiconductor device has first and second semiconductor packages 22 and 23 that are mounted in an overlapping manner on the mounting substrate 15. The first and the second semiconductor packages 22 and 23 have, respectively, semiconductor chips (not shown) and external leads 24 and 25 and are electrically connected, respectively, to the lands provided on the mounting substrate 15 via the external leads 24 and 25.

In this manner, according to the invention described in the above publication, the first and second semiconductor packages 22 and 23 are both directly mounted on the mounting substrate 15 and the above publication does not at all disclose that the second semiconductor package 23 which is in the above position is mounted on the first semiconductor package 22 which is in the below position. That is to say, in the above described publication the idea of mounting a semiconductor package onto another semiconductor package is not, at all, disclosed.

Since the first and the second semiconductor packages 22 and 23 are both directly mounted on the mounting substrate 15 via the external leads 24 and 25 as described above, the following problems arise.

As shown in FIG. 13, the external leads 24 of the first semiconductor package 22 which is located in the lower position, extend outward, and, therefore, it becomes necessary to secure the width d for these external leads 24. That is to say, the size of the first semiconductor package 22 becomes larger in the width direction because of the external leads 24.

In addition, the external leads 24 raise the resin part of the first semiconductor package 22 off of the mounting substrate 15 and, therefore, the thickness t shown in FIG. 13 becomes necessary, which results in the size of the first semiconductor package 22 becoming greater in the height direction.

On the other hand, since the external leads 25 of the second semiconductor package 23 are also connected to the mounting substrate 15, it becomes necessary for these external leads 25 to be arranged outside of the external leads 24 of the first semiconductor package 22. Therefore, the width of the second semiconductor package 23 becomes larger than the width of the first semiconductor package 22.

As described above, the size of the first semiconductor package 22 becomes larger and the size of the second semiconductor package 23 becomes, to an even greater extent, larger than the first semiconductor package 22 and, as a result, the problem arises that the size of the semiconductor device becomes larger in both the width direction horizontal direction) and the height direction (vertical direction) of the semiconductor device.

SUMMARY OF THE INVENTION

The present invention is provided to solve the above described problem. It is an object of the present invention to miniaturize a semiconductor device having a plurality of semiconductor packages.

A semiconductor device according to the present invention includes a first semiconductor package that has first lands on the upper surface and second lands on the lower (rear) surface for connection with a mounting substrate and a second semiconductor package that is mounted on the first semiconductor package and that has external conductive parts connected to the first lands.

By providing second lands on the lower surface of the first semiconductor package as described above, the first semiconductor package can be mounted on the mounting substrate without providing the first semiconductor package with external leads. Thereby, the size of the first semiconductor package can be reduced in both the width direction (horizontal direction) and the height direction (vertical direction). In addition, since the second semiconductor package is mounted on the first semiconductor package, it is not necessary to make the width of the second semiconductor package greater than the width of the first semiconductor package and the height of the second semiconductor package can also be reduced. Thereby, the size of the second semiconductor package can also be reduced in both the width direction and the height direction.

The above described first lands are, preferably, arranged on the peripheral part of the first semiconductor package. Thereby, the mounting of the second semiconductor package onto the first semiconductor package can be easily carried out.

The first semiconductor package has a first semiconductor chip, a resin part (molded or sealing part) for molding or sealing the first semiconductor chip and a substrate part, on which the resin part is mounted and which protrudes outward beyond the resin part, wherein the first lands is arranged on the part which protrudes outward beyond the resin part in the substrate part. On the other hand, the second semiconductor package has a second semiconductor chip.

By providing the first semiconductor package with the above described substrate part, the first lands can be arranged on the peripheral part which protrudes outward beyond the resin part in the substrate part. In this manner, the first lands are arranged on the substrate part and, thereby, the formation of the first lands can be easily carried out. In addition, by providing the above described substrate part, the second lands (terminals for external connection) can be arranged in an array form on the entire lower surface of the substrate part and, therefore, a miniaturization of the semiconductor device and an increase of the number of pins become possible.

In the above described substrate part, it is preferable to electrically connect the first and the second packages. Thereby, the second lands (terminals for external connection) of the first and the second semiconductor packages can be shared so that the number of the terminals of the semiconductor device, for external connection, can be reduced.

Third lands that are electrically connected to the first semiconductor chip via wires are provided on said substrate part while the resin part preferably reaches to the substrate part and covers the wires and the third lands.

In this manner, the resin part is formed directly on the substrate part and, thereby, the height of the first semiconductor package can be reduced. In addition, by adopting the above described structure, it becomes unnecessary to provide conductive parts, extending outside of the resin part, on the substrate part.

The above described substrate part may have a recess. In this case, it is preferable to locate the resin part within the recess. Thereby, the resin part can be avoided from protruding from the substrate part so that the mounting of the second semiconductor package onto the first semiconductor package can be carried out more easily.

The second semiconductor package has a die pad for mounting the second semiconductor chip and a molding or sealing resin (molding or sealing part) for molding the second semiconductor chip and the external conductive parts include external leads which extend outward from the side of the molding resin, wherein the external leads, preferably, are bent in the direction toward the first semiconductor package.

In this manner, the external leads are bent in the direction toward the first semiconductor package and, thereby, the second semiconductor package can be easily mounted onto the first semiconductor package even in the case that the resin part of the first semiconductor package protrudes on the above described substrate part.

The above described first semiconductor chip includes a logic device while the second semiconductor chip includes a memory device.

Thereby, it becomes unnecessary to provide, for example, both a logic IC (integrated circuit), which includes a logic device, and a memory IC, which includes a memory device, in one chip and, therefore, the period of time necessary for development can be shortened and chip size restrictions can be avoided.

The second semiconductor chip is mounted onto the above described die pad and a third semiconductor chip may be layered or stacked on the second semiconductor chip. In this case, it is preferable to expose the die pad on the surface of the molding resin.

In addition, the second semiconductor chip is mounted onto the above described die pad and a third semiconductor chip may be mounted beneath (on the rear surface) the die pad. Furthermore, a fourth semiconductor chip may be layered on top of the first semiconductor chip.

In this manner, at least one of the first and second semiconductor packages has a plurality of semiconductor chips and, thereby, an enhancement of the performance of the semiconductor device can be achieved. In addition, in the case that the die pad is exposed on the surface of the molding resin, the thickness of the second semiconductor package can be reduced. In addition, in the case that semiconductor chips are arranged on both surfaces of the die pad, chip size restrictions can be avoided.

Solder bumps for external connection may be formed on the above described second lands. Thereby, the first semiconductor package can be mounted onto the mounting substrate via the solder bumps such as solder balls.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention are described in reference to FIGS. 1 to 12.

First Embodiment

Figure 1:
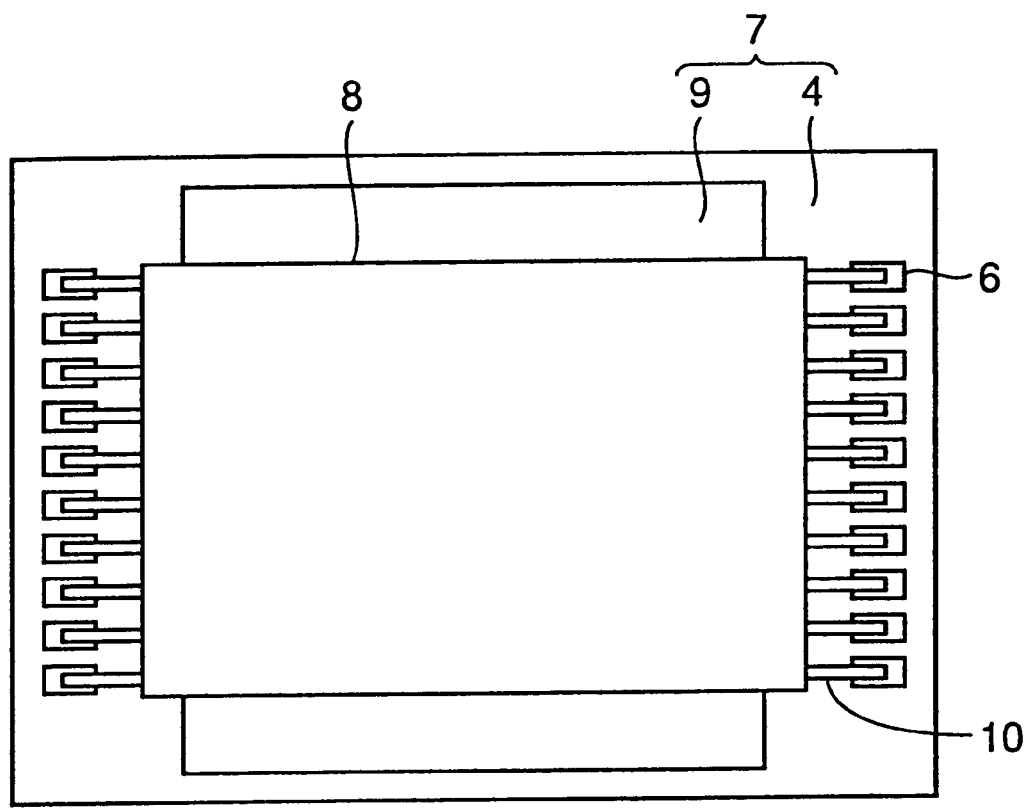
FIG. 1 is a plan view of a semiconductor device according to a first embodiment of the present invention.
Figure 2:
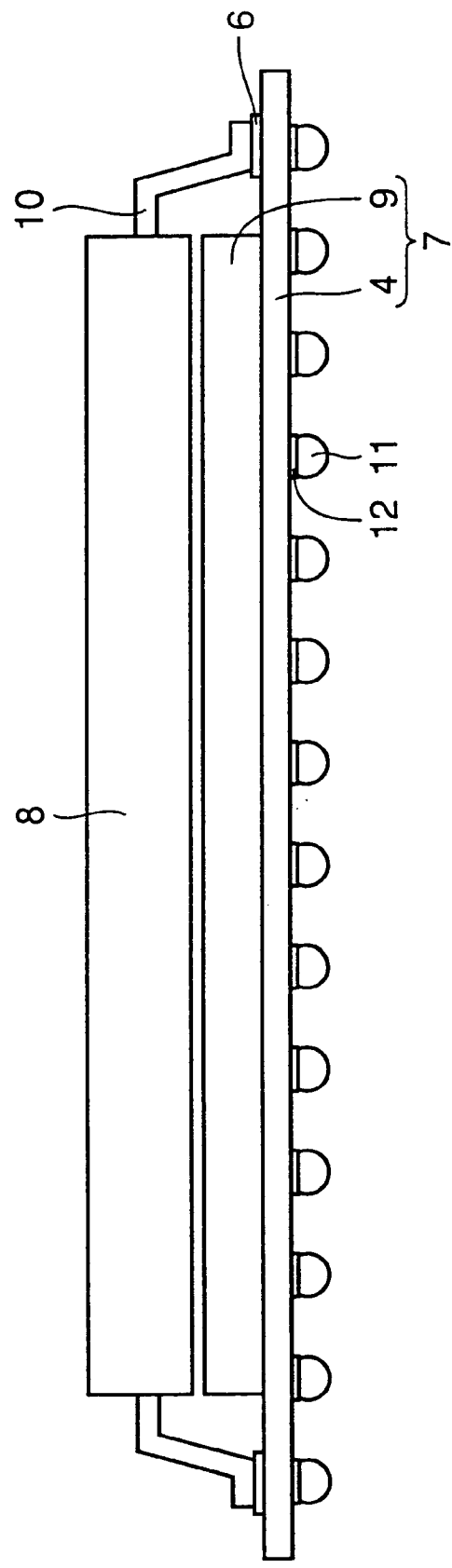
FIG. 2 is a side view of the semiconductor device shown in FIG. 1.
Figure 3:
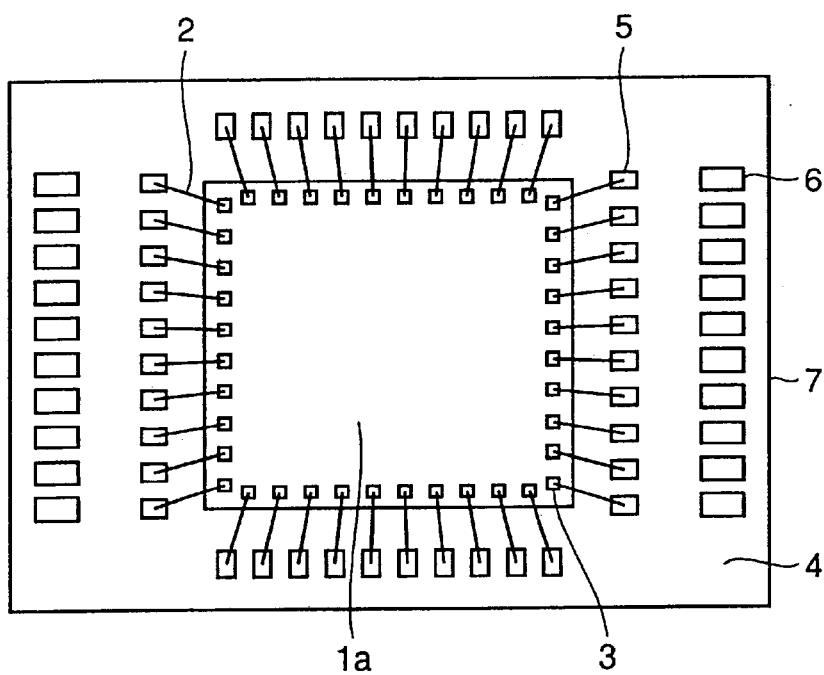
FIG. 3 is a plan view of a part of the first semiconductor package shown in FIG. 1 from which the resin part (molding part) has been removed.
Figure 4:
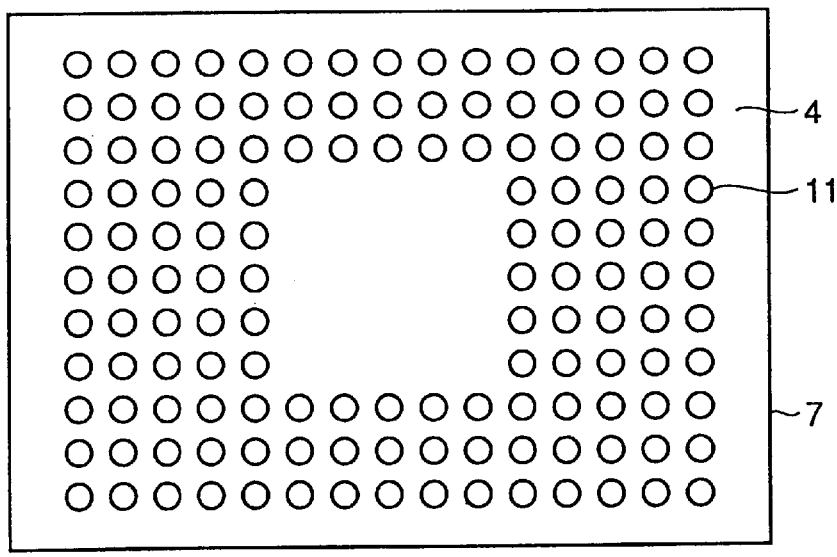
FIG. 4 is a bottom view of the semiconductor device shown in FIG. 1.
Figure 5:
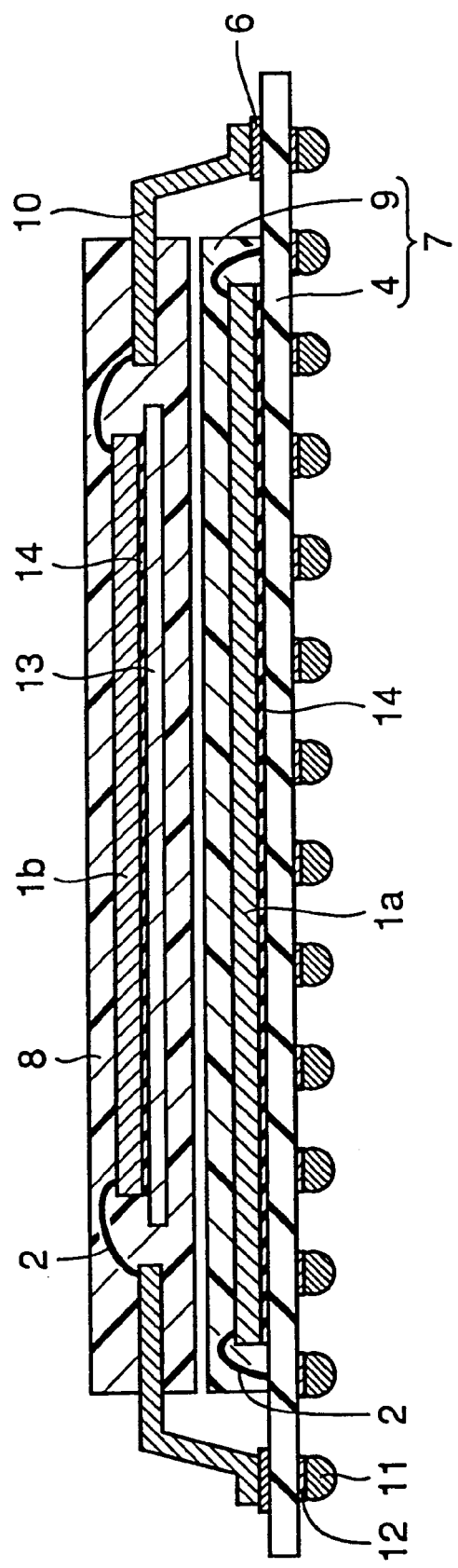
FIG. 5 is a cross section view of the semiconductor device shown in FIG. 1.
Figure 6:
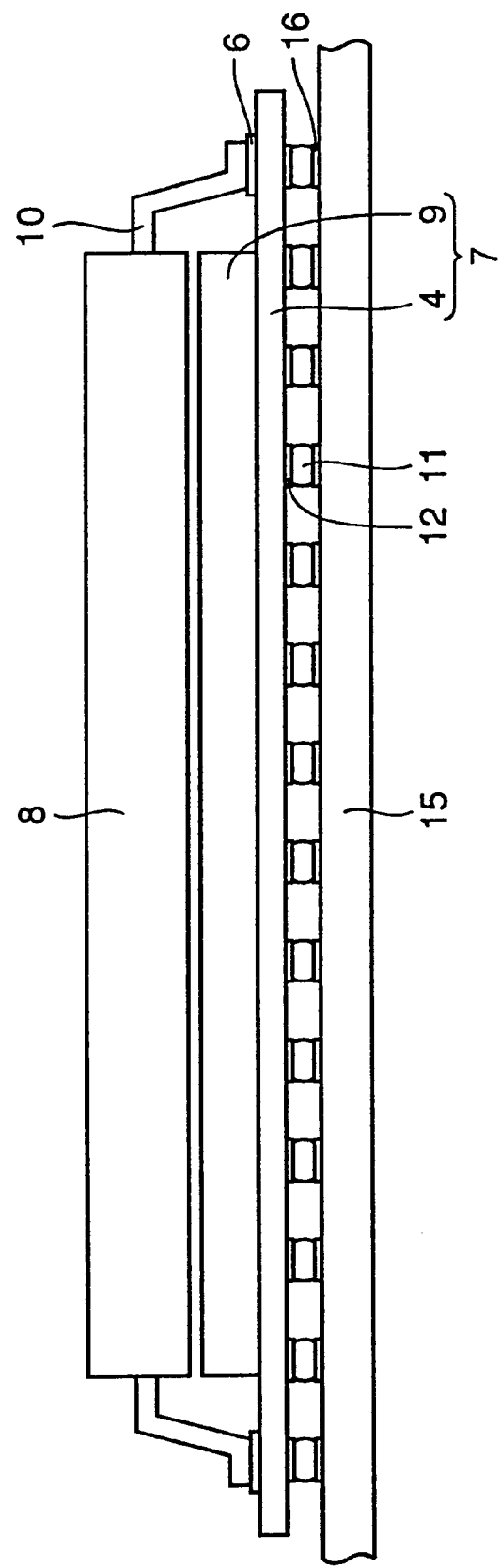
FIG. 6 is a side view showing the condition where the semiconductor device shown in FIG. 1 is mounted onto the mounting substrate.

FIG. 1 is a plan view of a semiconductor device according to the first embodiment of the present invention, FIG. 2 is a side view of the semiconductor device in the first embodiment, FIG. 3 is a plan view of the first semiconductor package from which the resin part is removed, FIG. 4 is a bottom view of the semiconductor device in the first embodiment and FIG. 5 is a cross section view of the semiconductor device in the first embodiment. FIG. 6 is a side view showing the condition where the semiconductor device in the first embodiment is mounted onto a mounting substrate.

As shown in FIGS. 1 and 2, the semiconductor device in the first embodiment includes a first semiconductor package 7 and a second semiconductor package 8 that is mounted onto this first semiconductor package 7. The thickness of the entire semiconductor device is, for example, approximately 1.0 mm to 1.2 mm, while the thickness of the first and the second semiconductor packages 7 and 8 are, for example, approximately 500 $\mu$m to 600 $\mu$m.

The first semiconductor package 7 that is in the below position has, as shown in FIGS. 1 to 4, a semiconductor chip 1a, a substrate part 4, lands (third lands) 5 for wire connection, lands (first lands) 6 for mounting the second semiconductor package, a resin part (molding or sealing part) 9, solder balls (solder bumps) 11 and lands (second lands) 12 for external connection.

The substrate part 4 protrudes outward beyond the resin part 9 as shown in FIGS. 1 and 2 and is formed of, for example, glass epoxy, or the like, which has the thickness of approximately 100 $\mu$m to 200 $\mu$m. The thickness of the substrate part 4 is, for example, approximately 10% to 20% of the entire thickness of the semiconductor device and is approximately 15% to 30% of the thickness of the first semiconductor package 7. Thereby, the strength necessary for the substrate part 4 can be secured.

As shown in FIG. 3, the lands 5 for wire connection and the lands 6 for connecting the second semiconductor package are formed on the upper surface of the substrate part 4 while, as shown in FIG. 2, the lands 12 for external connection are formed on the lower surface of the substrate part 4.

The lands 5 for wire connection are, as shown in FIG. 3, located around the first semiconductor chip 1a so as to surround the first semiconductor chip 1a and are formed of a metal layer (conductive layer), such as of Cu.

Bonding pads 3 are formed on the peripheral part of the first semiconductor chip 1a and these bonding pads 3 are connected to the lands 5 for wire connection via wires 2 made of gold, or the like.

The resin part 9 is formed of a thermo set resin such as an epoxy resin, molds the first semiconductor chip 1a, covers the first semiconductor chip 1a, the wire 2 and the land 5 for wire connection and reaches to the substrate part 4.

In this manner, the resin part 9 is formed directly on the substrate part 4 and, therefore, as shown in FIG. 2, it becomes unnecessary to form a conductive part from the side of the resin part 9 toward the substrate part 4 so that the first semiconductor package 7 can be made compact in the width direction. In addition, the height of the first semiconductor package 7 can be reduced in comparison with a conventional case where the package has external leads.

Accordingly, the first semiconductor package 7 can be reduced in both the width direction and the height direction. Since the second semiconductor package 8 is mounted onto this first semiconductor package 7, it becomes unnecessary to make the width of the second semiconductor package 8 greater than the width of the first semiconductor package 7, which results, additionally, in a reduction of the size of the second semiconductor package 8. As a result, the size of the semiconductor device can be made compact (Effect 1 of the present invention).

The lands 6 for mounting the second semiconductor package are arranged on the peripheral part of the first semiconductor package 7 as shown in FIGS. 1 to 3 and are formed of a metal layer such as of Cu. In particular, the lands 6 for mounting the second semiconductor package are arranged on the peripheral part of the substrate part 4 which protrudes outward beyond the resin part 9.

Thereby, not only can the formation of the lands 6 for mounting the second semiconductor package be easily carried out but also can the mounting of the second semiconductor package 8 to the first semiconductor package 7 be easily carried out (Effect 2 of the present invention).

The lands 12 for external connection are formed on the lower surface of the substrate part 4 and are formed of a metal layer such as of Cu. It is preferable to form these lands 12 for external connection in an array form on the entire lower surface of the substrate part 4. By providing such lands 12 for external connection, miniaturization of the semiconductor device and an increase of the number of the pins become possible (Effect 3 of the present invention).

As shown in FIG. 2, the solder balls 11 are formed on the lands 12 for external connection. Accordingly, as shown in FIG. 4, the solder balls 11 are also formed on the entire lower surface of the substrate part 4 in a comprehensive manner.

Here, the solder balls 11 can be omitted. By omitting the solder balls 11, the semiconductor device can further be made thinner.

Figure 7:
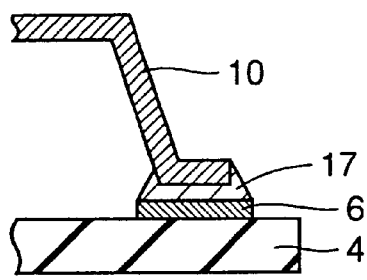
FIG. 7 is an enlarged view of a connection part between an external lead of the second semiconductor package and a land of the first semiconductor package.
Figure 8:
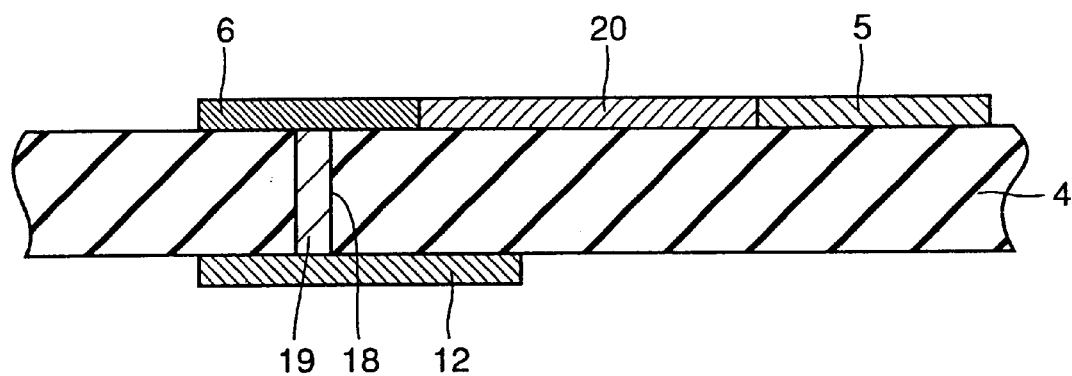
FIG. 8 is a cross section view showing an example of the internal structure of a substrate part in the first semiconductor package.

Next, in reference to FIGS. 5, 7 and 8, the cross section structure of the semiconductor device in the present embodiment is described.

As shown in FIG. 5, the first semiconductor chip 1a is mounted onto the substrate part 4 of the first semiconductor package 7 via a bonding material 14 and the first semiconductor chip 1a is sealed within the resin part 9.

The second semiconductor package 8 has a second semiconductor chip 1b, a die pad 13 for mounting the second semiconductor chip 1b, a molding resin for sealing in the second semiconductor chip 1b and external leads 10 which extend outward from the side of the molding resin.

The second semiconductor chip 1b is mounted onto the die pad 13 via the bonding material 14 and the external leads 10 are bent in the direction toward the first semiconductor package 7.

In this manner, the external leads 10 are bent in the direction toward the first semiconductor package 7 and, thereby, the second semiconductor package 8 can be easily mounted onto the first semiconductor package 7 even in the case that the resin part 9 of the first semiconductor package 7 protrudes onto the substrate part 4 as shown in FIG. 5 (Effect 4 of the present invention). An external conductive part other than external leads 10 may be provided in second semiconductor package 8.

The first semiconductor chip 1a shown in FIG. 5 is a logic IC, which includes a logic device, while the second semiconductor chip 1b is a memory IC, which includes a memory device.

In this manner, a plurality of semiconductor chips is mounted in one semiconductor device and, thereby, an enhancement of the performance of the semiconductor device can be achieved (Effect 5 of the present invention). In addition, by mounting the logic IC and the memory IC in separate semiconductor packages, it becomes unnecessary to provide both of them in one chip and, therefore, the period of time for development can be shortened (Effect 6 of the present invention). Furthermore, the semiconductor chips are not layered, as shown in FIG. 5, and, thereby, chip size restrictions can be avoided (Effect 7 of the present invention).

FIG. 7 shows an example of the structure of a connection part between an external lead 10 of the second semiconductor package 8 and a land 6 for mounting the second semiconductor package. As shown in FIG. 7, the external lead 10 and the land 6 for mounting the second semiconductor package are connected via, for example, a solder layer (conductive layer) 17. This solder layer 17 can be formed through plating, application by means of a dispenser, or the like.

In order to mount the second semiconductor package 8 onto the first semiconductor package 7, for example, a solder layer 17 is formed in advance on the lands 6 for mounting the second semiconductor package by means of the above described method so that the second semiconductor package 8 is placed onto the lands 6 for mounting the second semiconductor package and the solder layer 17 may be melt in this condition.

FIG. 8 shows an enlarged cross section view of the substrate part 4. As shown in FIG. 8, a through hole 18 is provided in the substrate part 4 and a conductive layer (through hole wire) 19 is formed within this through hole 18. Then, a land 6 for mounting the second semiconductor package and a land 12 for external connection are connected through the conductive layer 19. In addition, a wire 20 is formed on the upper surface of the substrate part 4 for connecting the land 6 for mounting the second semiconductor package and the land 5 for wire connection.

Thereby, in the substrate part 4, the first and the second semiconductor packages 7 and 8 can be electrically connected so that the lands 12 for external connection of the first and the second semiconductor packages 7 and 8 can be shared. As a result, the number of the terminals for external connection of the semiconductor device can be reduced (Effect 8 of the present invention).

FIG. 6 shows the condition where a semiconductor device of the present invention which has the above described structure is mounted on a mounting substrate 15.

As shown in FIG. 6, lands 16, for mounting on the mounting substrate 15, and lands 12, for external connection, are connected via conductive material, such as solder balls 11. Thereby, the first semiconductor package 7 can be mounted onto the mounting substrate 15 without providing the first semiconductor package 7 with external leads.

Next, an example of a process for a semiconductor device according to the first embodiment is described.

In order to produce a semiconductor device according to the first embodiment, first, the first and the second semiconductor packages 7 and 8 are assembled, respectively, in different processes.

In order to assemble the semiconductor package 7, the lands 5 for wire connection, the lands 6 for mounting the second semiconductor package and the lands 12 for external connection are formed in predetermined positions on the upper surface of, as well as on the lower surface of, the substrate part 4 and, in addition, predetermined wires are formed on the surfaces of, as well as inside of, the substrate part 4.

After that, the first semiconductor chip 1a is attached to the upper surface of the substrate part 4 via the bonding layer 14 and the bonding pads 3 of the first semiconductor chip 1a and the lands 5 for wire connection are connected with the wires 2 through a wire bonding method.

Next, a molding technique, such as a transfer molding method, is used to mold the resin so as to seal in the first semiconductor chip 1a, as well as the periphery thereof. Thereby, the resin part 9 is formed. Then, after assembling the first semiconductor package 7, an electrical test is carried out.

On the other hand, as for the second semiconductor package 8, the second semiconductor chip 1b is attached to the die pad 13 via the bonding layer 14 and, then, the bonding pads of the second semiconductor chip 1b and the internal leads are connected with the wires 2 through a wire bonding method.

After that, a molding technique, such as a transfer molding method, is used to mold the resin so as to seal in the second semiconductor chip 1b and a bending process is carried out on the external leads 10. Then, after assembling the second semiconductor package, an electrical test is carried out.

After carrying out electrical tests separately for the first and the second semiconductor packages 7 and 8, respectively, as described above, the second semiconductor package 8 is mounted onto the first semiconductor package 7. Thereby, the yield can be improved and the processing cost can be reduced (Effect 9 of the present invention).

Second Embodiment

Figure 9:
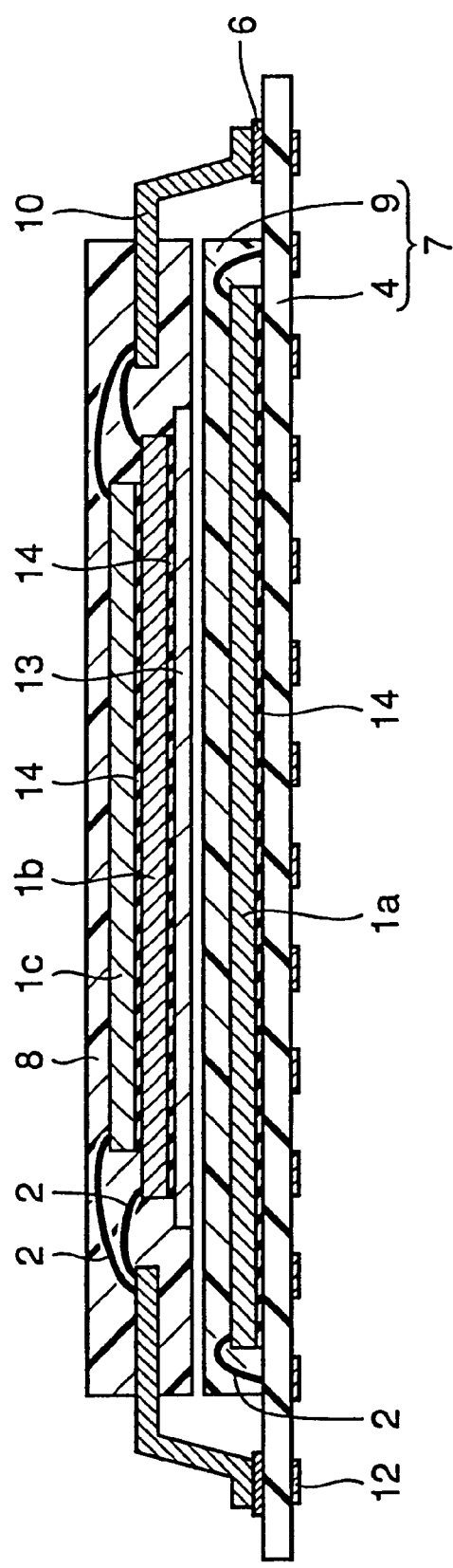
FIG. 9 is a cross section view of a semiconductor device according to a second embodiment of the present invention.

Next, the second embodiment of the present invention is described in reference to FIG. 9. FIG. 9 is a cross section view showing a semiconductor device of the second embodiment.

In the second embodiment, as shown in FIG. 9, a third semiconductor chip 1c, which is a memory IC, is layered, via a bonding material 14, on the second semiconductor chip 1b, which is a memory IC, wherein a memory device such as an SRAM (static random access memory) or an EEPROM (electrically erasable and programmable read only memory) is mounted, wherein solder balls are omitted. In addition, the second and the third semiconductor chips 1b and 1c are connected, respectively, to the internal leads via the wires 2 and the die pad 13 is exposed on the surface of the second semiconductor package 8.

The parts of the configuration, other than as described above, are essentially the same as in the first embodiment and a repetition of the descriptions is omitted.

A semiconductor device according to the second embodiment has basically the same structure as that of the semiconductor device according to the first embodiment as described above and, therefore, Effects of the present invention 1 to 4, 6, 8 and 9 can be gained.

In addition, the semiconductor device of the second embodiment has three semiconductor chips mounted thereon and, therefore, an additional enhancement of the performance of the semiconductor device can be achieved (Effect 10 of the present invention).

In addition, since the first semiconductor chip 1a, which is a logic IC, is contained in the first semiconductor package 7 while the second and the third semiconductor chips 1b and 1c, which are memory ICs, are contained in the second semiconductor package 8, it is not necessary to modify the first semiconductor chip 1a to the chip sizes of the second and third semiconductor chips 1b and 1c (Effect 11 of the present invention).

In addition, since the die pad 13 is exposed on the surface of the second semiconductor package 8, the thickness of the second semiconductor package 8 can be reduced and, moreover, since solder balls are not provided on the lands 12 for external connection, the thickness of the first semiconductor package 7 can also be reduced. Thereby, the entire thickness of the semiconductor device can be reduced (Effect 12 of the present invention).

Here, as for processes of the second embodiment, below described third and fourth embodiments, the process of the first embodiment may be slightly modified and, therefore, the descriptions of these processes are omitted.

Third Embodiment

Figure 10:
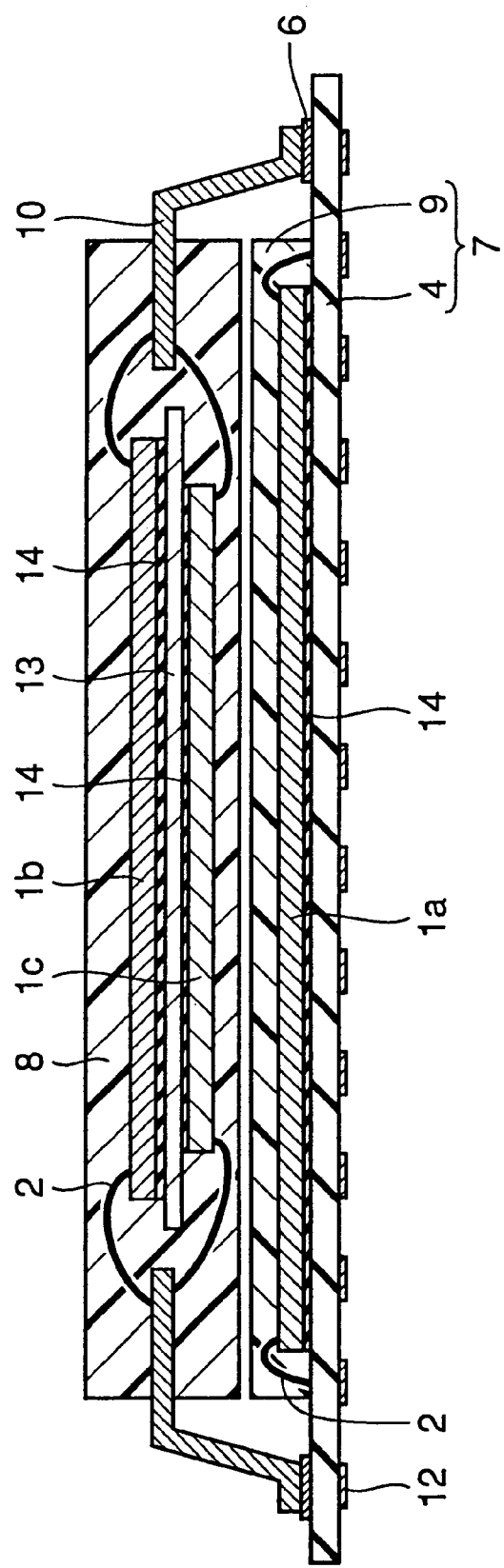
FIG. 10 is a cross section view of a semiconductor device according to a third embodiment of the present invention.

Next, the third embodiment of the present invention is described in reference to FIG. 10. FIG. 10 is a cross section view showing a semiconductor device of the third embodiment.

In the third embodiment, as shown in FIG. 10, the above described second and third semiconductor chips (memory ICs) 1b and 1c are attached to the upper surface and the lower surface of the die pad 13 and they are connected with the internal leads via wires 2.

In addition, solder balls are not provided on the lands 12 for external connection. Thereby, the thickness of the semiconductor device can be reduced. The configuration other than that is basically the same as in the first embodiment and the repeated descriptions are omitted.

A semiconductor device according to the third embodiment has also basically the same configuration as that of the semiconductor device according to the first embodiment and, therefore, Effects 1 to 4, 6, 8 to 9 can be gained. In addition, in the same manner as in the case of the second embodiment, Effect 10 of the present invention can also be gained.

In addition, semiconductor chips are mounted on the top and the bottom of the die pad 13 in the second semiconductor package 8 and, therefore, there is no restriction of the chip size. Accordingly, the three chips can be assembled without the restriction of the chip size (Effect 13 of the present invention).

Fourth Embodiment

Figure 11:
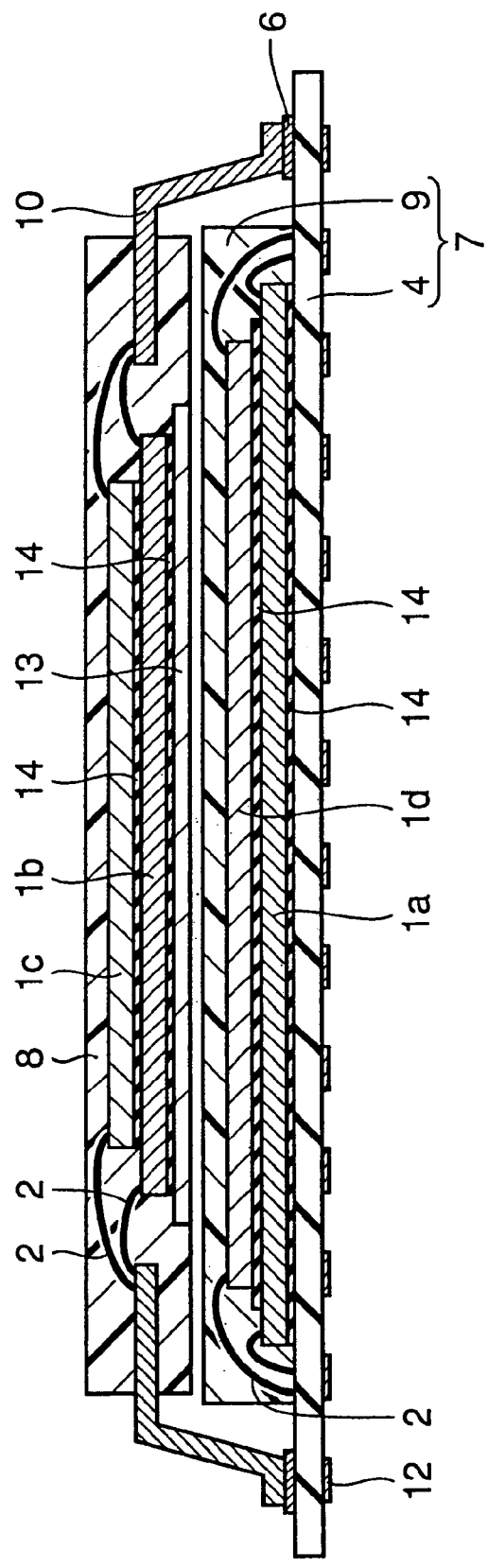
FIG. 11 is a cross section view of a semiconductor device according to a fourth embodiment of the present invention.

Next, the fourth embodiment of the present invention is described in reference to FIG. 11. FIG. 11 is a cross section view showing a semiconductor device of the fourth embodiment.

In the fourth embodiment, as shown in FIG. 11, the first semiconductor chip aogic IC) 1a and the fourth semiconductor chip (peripheral IC) 1d are layered, via the bonding material 14, on top of the surface of the substrate part 4 and the second and the third semiconductor chips (memory ICs) 1b and 1c are layered, via the bonding material 14, on top of the die pad 13.

Then, the first and the fourth semiconductor chips 1a and 1d are connected to the lands for wire connection provided on the substrate part 4 via the wires 2 while the second and the third semiconductor chips 1b and 1c are connected to the internal leads. In addition, solder balls are not provided on the lands 12, for external connection.

Here, the above described peripheral IC is an IC chip which has a peripheral circuit, such as a parallel-serial converting circuit, a refresh circuit, and the like, and, by incorporating such a chip into the semiconductor package, system functions can be generated and, therefore, an enhancement of the memory application system becomes possible (Effect 14 of the present invention).

The parts of the configuration, other than as described above, are essentially the same as in the first embodiment and a repetition of the descriptions is omitted.

A semiconductor device according to the fourth embodiment has essentially the same configuration as the semiconductor device according to the first embodiment and, therefore, Effects 1 to 4, 6, 8 and 9 of the present invention can be gained.

In addition, the semiconductor device of the fourth embodiment has four semiconductor chips mounted thereon and, therefore, a further enhancement of the function of the semiconductor device can be achieved (Effect 15 of the present invention).

In addition, since two semiconductor chips are mounted in each semiconductor package, chip size restriction limits can be reduced (Effect 16 of the present invention).

Fifth Embodiment

Figure 12:
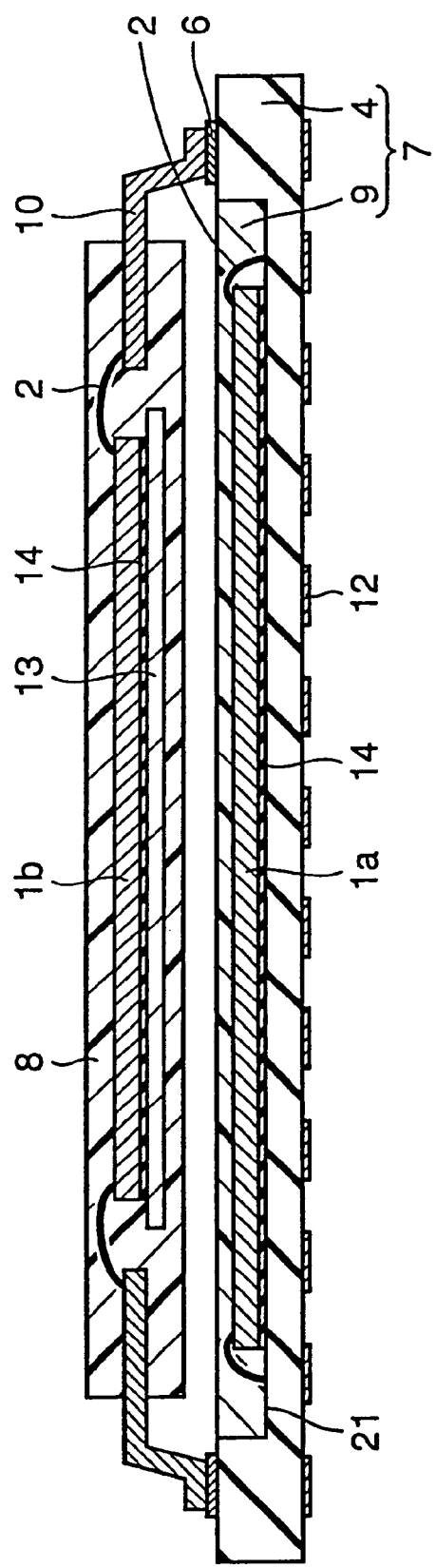
FIG. 12 is a cross section view of a semiconductor device according to a fifth embodiment of the present invention.
Figure 13:
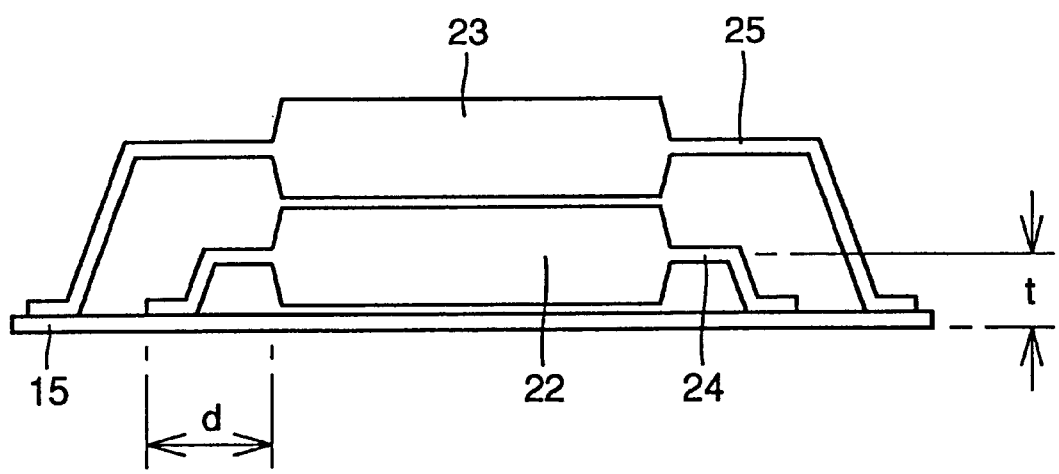
FIG. 13 is a side view showing an example of a semiconductor device according to a prior art.

Next, the fifth embodiment of the present invention is described in reference to FIG. 12. FIG. 12 is a cross section view showing a semiconductor device of the fifth embodiment.

In the fifth embodiment, as shown in FIG. 12, a recess 21 is provided in the center of the substrate part 4 so that the thickness of the peripheral part of the substrate part 4, located around the periphery of the recess 21, is greater than the thickness of the substrate part 4 directly beneath the recess 21. The recess 21 can be formed by carrying out, for example, spot facing processing.

Then, the first semiconductor chip 1a is fixed into the above described recess 21 and the first semiconductor chip is sealed into resin so that the resin part 9 is formed within the recess 21. Lands 5, for wire connection, are formed at the bottom of the recess 21 and the first semiconductor chip 1a is connected with the lands 5, for wire connection, through the wires 2.

The resin part 9 covers the wires 2 and the lands 5, for wire connection, and reaches to the bottom of the recess 21. In addition, the height to the top surface of the resin part 9 is, preferably, made approximately equal to the height of the peripheral part of the substrate part 4 as shown in FIG. 12. Thereby, the resin part 9 can be prevented from protruding above the substrate part 4 and, therefore, the mounting of the second semiconductor package 8 can be carried out more easily (Effect 17 of the present invention).

Lands 6 for mounting the second semiconductor package are arranged on the peripheral part, of the substrate part 4, of which the thickness is greater. Thereby, the strength of the substrate part 4 beneath the lands 6 for mounting the second semiconductor package can be enhanced so that reliability, after the mounting of the second semiconductor package 8, can be increased.

In addition, solder balls are not provided on the lands 12, for external connection. The parts of the configuration, other than as described above, are essentially the same as in the first embodiment and a repetition of the descriptions is omitted.

Since a semiconductor device according to the fifth embodiment has essentially the same configuration as that of the semiconductor device according to the first embodiment, the Effects 1 to 9 of the present invention can be gained.

In addition, in the semiconductor device of the fifth embodiment, since the upper surface of the substrate part 4 is approximately flat, a screen print method can be utilized at the time when solder is applied to the lands 6, for mounting the second semiconductor package, and, therefore, the application of the solder can be easily carried out (Effect 18 of the present invention).

The process for a semiconductor device according to the fifth embodiment is essentially the same as in the case of the first embodiment, except for the step of forming the recess 21 by carrying out spot facing processing, or the like, on the substrate part 4.

Though the embodiments of the present invention are described in the above manner, the contents of the description for each of the above described embodiments may be combined with each other.

According to the present invention, the first and the second semiconductor packages can both be reduced in both the width direction and the height direction and, therefore, a semiconductor device which includes these can also be reduced in both the width direction and the height direction. Accordingly, a semiconductor device including a plurality of semiconductor packages can be made compact.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a first semiconductor package including:
      a substrate having a first surface and a second surface;
      a first semiconductor chip bonded to the first surface of said substrate, said chip having a plurality of bonding pads;
      lands for mounting located on the first surface of said substrate, lands for wire bonding located on the first surface of said substrate and electrically connected to respective bonding pads of said first semiconductor chip;

a first group of lands for external connection located on the second surface of said substrate and electrically connected to respective lands for mounting;

a second group of lands for external connection located on the second surface of said substrate and electrically connected to respective lands for wire bonding; and a second semiconductor package including:
 a second semiconductor chip having a plurality of bonding pads; and
 external leads electrically connected to respective bonding pads of said second semiconductor chip and electrically connected to respective lands for mounting on the first surface of said substrate.

2. The semiconductor device according to claim 1, wherein said lands for mounting are arranged on a peripheral part of said substrate beyond said first semiconductor chip.

3. The semiconductor device according to claim 1, wherein:

said first semiconductor package further includes a resin part mounted on said substrate and encapsulating said first semiconductor chip, and said substrate extends outward, beyond said resin part;

said lands for mounting are arranged on the part of said substrate part which extends outward, beyond said resin part.

4. The semiconductor device according to claim 3, wherein said first and second semiconductor packages are electrically connected in said substrate.

5. The semiconductor device according to claim 3 including wires electrically connecting said bonding pads on said first semiconductor chip to said lands for wire bonding, wherein said resin part encapsulates said wires and lands for wire bonding.

6. The semiconductor device according to claim 3, wherein:

said substrate has a recess; and said resin part is located within the recess.

7. The semiconductor device according to claim 3, wherein:

said second semiconductor package has a die pad on which said second semiconductor chip is mounted and an encapsulating resin encapsulating said second semiconductor chip;

said external leads extend outward from said encapsulating resin; and said external leads are bent toward said first semiconductor package.

8. The semiconductor device according to claim 3, wherein:

said first semiconductor chip includes a logic device; and said second semiconductor chip includes a memory device.

9. The semiconductor device according to claim 7, wherein said second semiconductor package includes a third semiconductor chip mounted on said second semiconductor chip, said third semiconductor chip including a plurality of bonding pads, to respective bonding pads of said third semiconductor chip being electrically connected to corresponding external leads wherein said die pad is exposed at a surface of said encapsulating resin.

10. The semiconductor device according to claim 7, wherein said second semiconductor chip is mounted on a first surface of said die pad and including a third semiconductor chip mounted on a second surface of said die pad and including a plurality of bonding pads, respective bonding pads of said third semiconductor chip being electrically connected to corresponding lands for wire bonding.

11. The semiconductor device according to claim 3, wherein said semiconductor package includes a third semiconductor chip mounted on said first semiconductor chip and including a plurality of bonding pads, respective bonding pads of said third semiconductor chip being electrically connected to corresponding lands for wire bonding.

12. The semiconductor device according to claim 1, including solder bumps for external connection located on said first and second groups of lands for external connection.

13. The semiconductor device according to claim 1, wherein said first semiconductor chip is located between said substrate and said second semiconductor package.

* * * * *

UNITED STATES PATENT AND TRADEMARK OFFICE
CERTIFICATE OF CORRECTION

PATENT NO.    : 6,445,064 B1
DATED         : September 3, 2002
INVENTOR(S)   : Ishii et al.

It is certified that error appears in the above-identified patent and that said Letters Patent is hereby corrected as shown below:

<u>Title page,</u>
Item [54], change the title from "SEMICONDUCTOR DEVICE" to
-- DUAL PACKAGE SEMICONDUCTOR DEVICE --.
Item [56], References Cited, change "6,256,760" to -- 6,265,760 --.

Signed and Sealed this

First Day of April, 2003

JAMES E. ROGAN
*Director of the United States Patent and Trademark Office*